(12) United States Patent
Herndon, Jr. et al.

(10) Patent No.: US 10,468,784 B1
(45) Date of Patent: Nov. 5, 2019

(54) PASSIVE DETECTION AND VECTORING OF MATERIALS

(71) Applicant: Magnetotellurics Detection Technologies, LLC, Elijay, GA (US)

(72) Inventors: Sidney G. Herndon, Jr., Ellijay, GA (US); Billy L. Dollarhide, Sherman, TX (US)

(73) Assignee: Magnetotellurics Detection Technologies, LLC, Elijay, GA (US)

( * ) Notice: Subject to any disclaimer, the term of this patent is extended or adjusted under 35 U.S.C. 154(b) by 0 days.

(21) Appl. No.: 16/365,054

(22) Filed: Mar. 26, 2019

(51) Int. Cl.
*H01Q 21/29* (2006.01)
*G01R 29/08* (2006.01)

(52) U.S. Cl.
CPC ......... *H01Q 21/29* (2013.01); *G01R 29/0871* (2013.01); *G01R 29/0878* (2013.01); *G01R 29/0892* (2013.01)

(58) Field of Classification Search
CPC ............................... H01Q 21/29; G01R 29/08
USPC ......................................................... 343/703
See application file for complete search history.

(56) References Cited

U.S. PATENT DOCUMENTS

2009/0027281 A1* 1/2009 Walters .................. G01R 29/14
343/703

OTHER PUBLICATIONS

Naidu, G.D., Deep Crustal Structure of the Son-Narmada-Taptil Lineament, Central India, 2012, Chapter 2, Magnetotellurics: Basic Theoretical Concepts, pp. 13-25.

* cited by examiner

*Primary Examiner* — Andrea Lindgren Baltzell
(74) *Attorney, Agent, or Firm* — Charles L. Warner; The Van Winkle Law Firm

(57) ABSTRACT

An apparatus (100) and method (300) of detecting and determining a vector to a specified material using an H-field antenna (102A) and an E-field antenna (102B), each antenna having at least one coil portion (102A1, 102B1) wound around at least one corresponding rod portion (102B1, 102B2), the coil portions being electrically connected in parallel, and the rod portions being electrically connected in parallel. The specified material is deemed to be present in the field of view of the E-field antenna based upon a change in orientation of the H-field antenna when a first current is applied to the coil portions through a first resistor (606A). An orientation to, and a distance to, the specified material is determined based upon a new orientation of the H-field antenna and the resistivity of a second resistor (606B) when a second current is applied through the second resistor to the rod portions.

20 Claims, 11 Drawing Sheets

PASSIVE DETECTION AND VECTORING OF MATERIALS

BACKGROUND

It is desirable to detect and vector materials, particularly specified materials, from a distance in a basically passive manner; that is, without the use of an active radiating system such as radar, laser, x-ray, and sonar.

SUMMARY

The naturally occurring electric field (E-field) and magnetic field (H-field) in an area of interest are used to detect a specified material in that area, and to determine the vector to that specified material, that is, to determine the angular bearing to the specified material and the distance (range) to the specified material.

DETAILED DESCRIPTION

Figure 1:
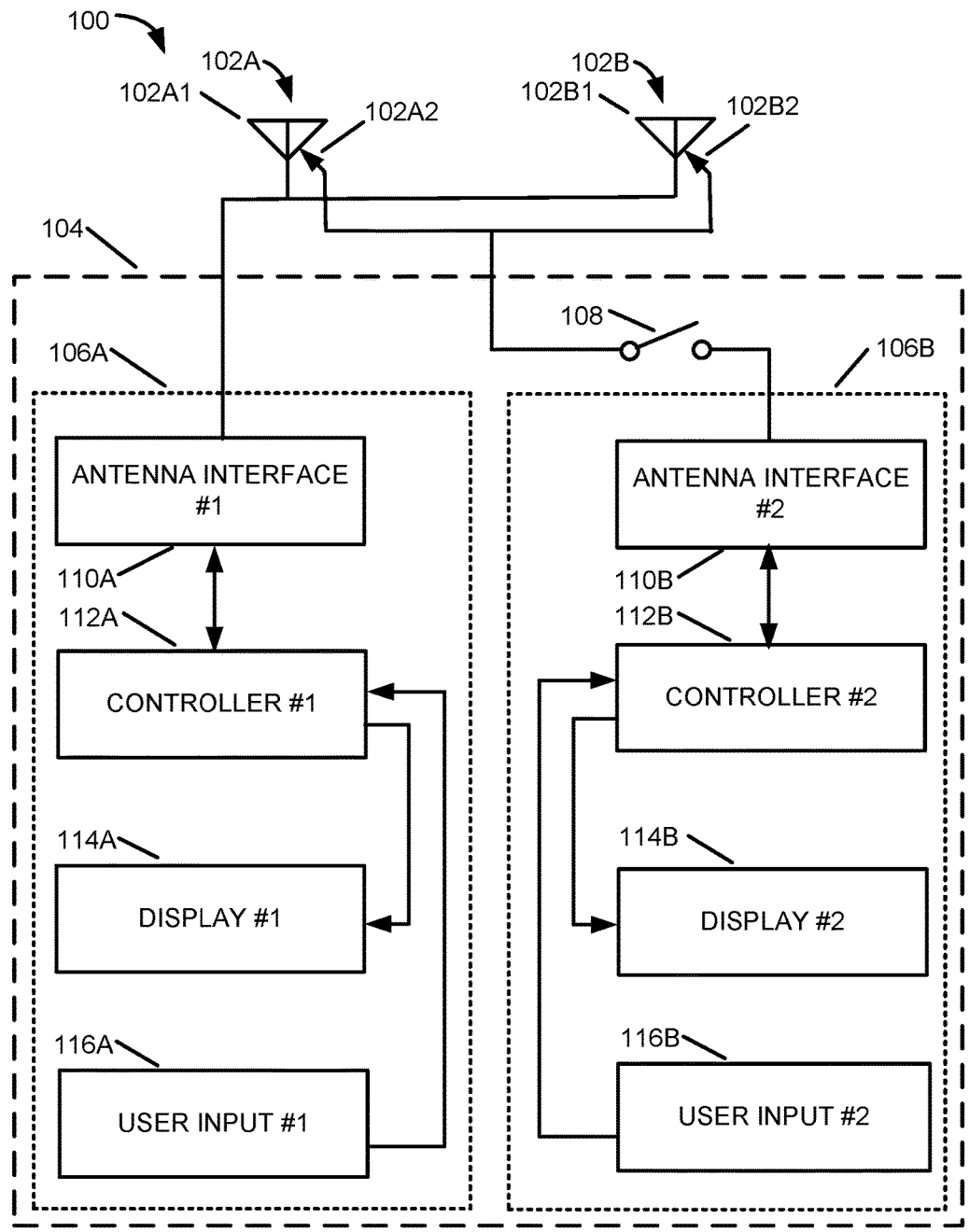
FIG. 1 is a block diagram of an exemplary passive detection and vectoring system.

The following detailed description is directed to concepts and technologies for passive detection and vectoring of specified materials from a distance using techniques based on magnetotellurics. In the following detailed description, references are made to the accompanying drawings that form a part hereof, and in which are shown by way of illustration specific embodiments or examples. Referring now to the drawing, in which like numerals represent like elements throughout the several figures, aspects of a system and method for such passive detection and vectoring are presented.

FIG. 1 is a block diagram of an exemplary passive detection and vectoring system 100. The system 100 comprises an H-field antenna 102A, an E-field antenna 102B, and a signal processing system 104. The H-field antenna 102A has two components: 102A1 and 102A2. The E-field antenna 102B also has two components: 102B1 and 102B2. The signal processing system 104 comprises a direction processing unit 106A, a distance processing unit 106B, and a switch 108. The direction processing unit 106A comprises a first antenna interface 110A, a first controller 112A, a first optional display 114A, and a first optional user input device 116A. The distance processing unit 106B comprises a second antenna interface 110B, a second controller 112B, a second optional display 114B, and a second optional user input device 116B.

The displays 114 may be any desired and convenient display, such as but not limited to, a display screen, a touch screen, a printer, a speaker or speakers, one or more lights, one or tactile devices, or any other device by which a human can perceive information.

The user input devices 116 may be any desired and convenient input device, such as but not limited to, a mouse, a keyboard, a touch screen, switches, push buttons, or any other device by which a human can provide information and/or instructions to the passive detection system 100.

The user input devices 116 and the user output devices 114 may be embodied in the same component, such as a touch-sensitive screen. Also, a user input device 116 and a user output device 114 may be integral with the signal processing system 104, such as in the case of a handheld device, or may be separate components, such as a keyboard, a mouse, and display.

Although two controllers 112A, 112B, two displays 114A, 114B, and two user input devices 116A, 116B, are shown, such duplication was for convenience in the design and testing of the passive detection system 100. In a preferred implementation, only one controller, one display, and one user input device would be used to control both antenna interfaces 110A, 110B, and switch 108.

Figure 2:
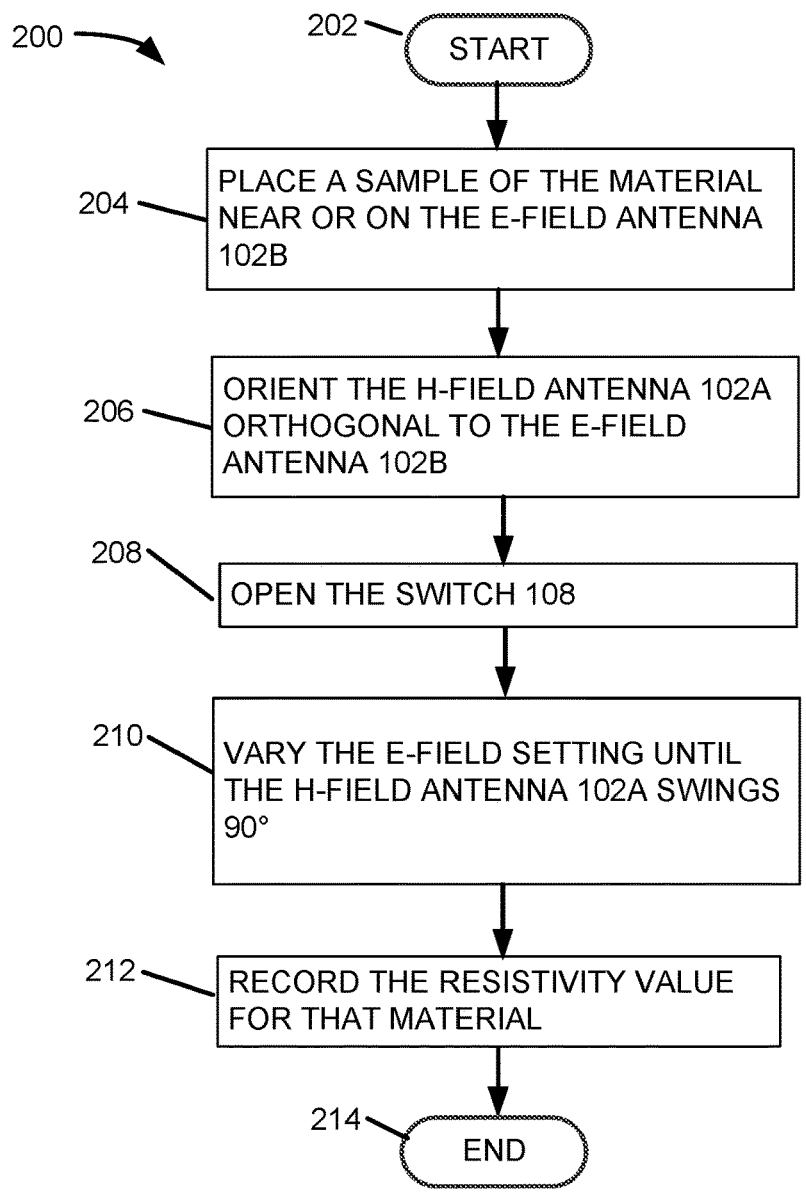
FIG. 2 is a flow chart illustrating an exemplary method of determining the resistivity of a desired material.

FIG. 2 is a flow chart illustrating an exemplary method 200 of determining the resistivity of a desired material, such as a particular solid of interest, a particular powder of interest, or a particular liquid of interest. After starting 202, the user places 204 a sample of a desired material on/near the E-field antenna 102B. The H-field antenna 102A is placed 206 near and orthogonal to the E-field antenna 102B, but does not have to be placed immediately adjacent to the sample.

The user then opens 208 the switch 108. The user then varies 210 the material resistivity setting (the "material setting"), such as via user input device 116A, until a setting is found whereby the H-field antenna 102A swings ±90 degrees from its original orientation. This ±90 degree orientation may or may not point toward the sample. The 90-degree swing indicates that the resistivity of the sample has been determined. That resistivity value, or the corresponding current value, may then be manually recorded 212 or stored by the system 100 to be associated with the material represented by that sample.

Figure 3:
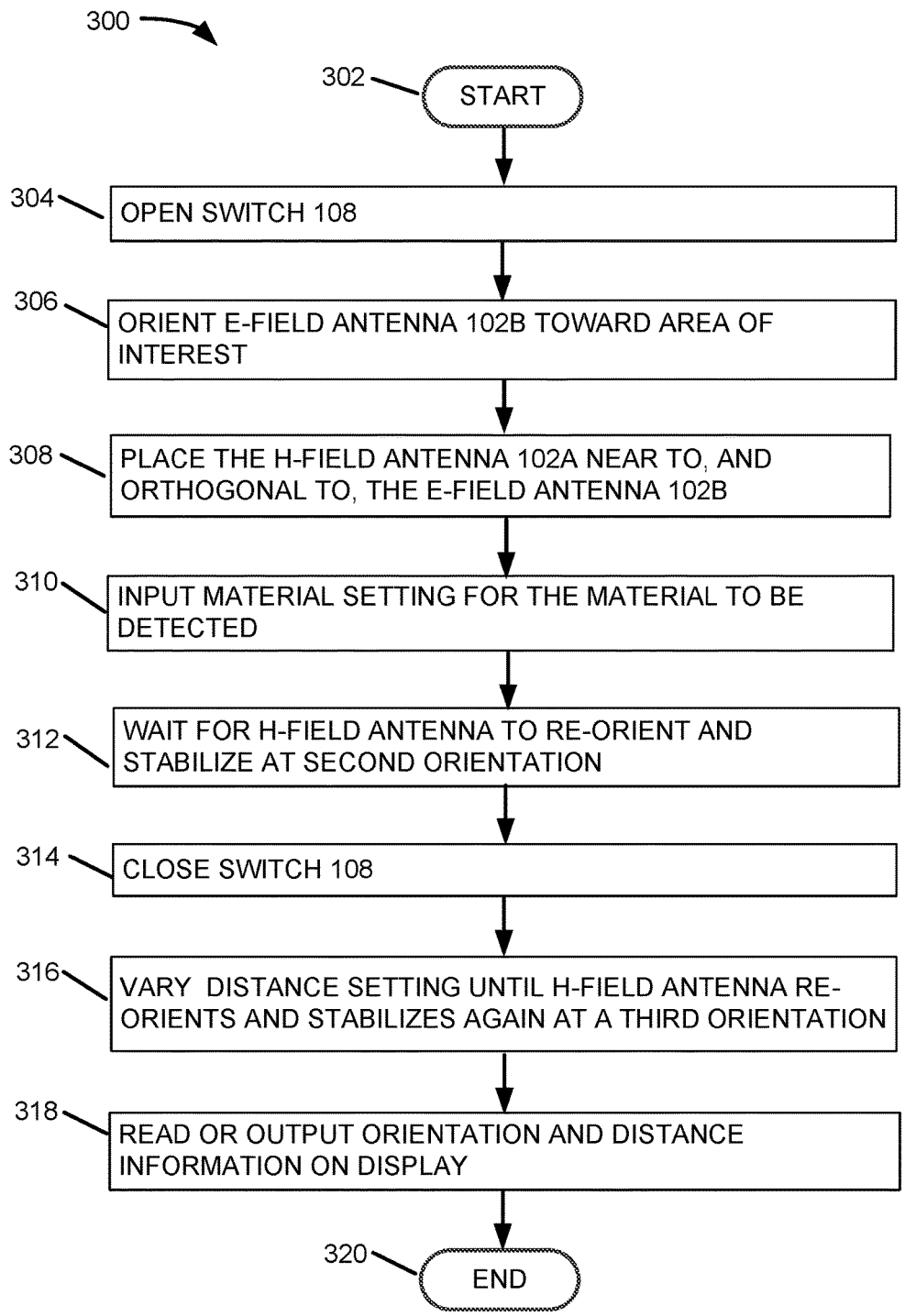
FIG. 3 is a flow chart illustrating an exemplary method of operation of the passive detection and vectoring system.

The material type of the sample and the resistivity value are recorded so that when it is desired to locate that specific material, such as described in FIG. 3, the material setting for that material is already known. The order of operations 204, 206, and 208 is not critical; they may be performed in any desired order. The process 200 can be repeated for different types of materials, so as to build up a library or table of materials and their corresponding material settings.

FIG. 3 is a flow chart illustrating an exemplary method of operation 300 of the passive detection and vectoring system. The operations may be briefly summarized as: (1) detecting or discovering the specified material (operations 304-312); and (2) locating the specified material—determining the orientation (azimuth, direction, angular bearing) and the distance to the specified material (operations 314-318).

More particularly discussed, starting at operation 302, the detecting process is commenced by opening 304 the switch 108 so that the second antenna interface 110B is not providing current to the antenna components 102A2 and 102B2.

The E-field antenna 102B is initially oriented 306 toward (generally facing) the area of interest. This initial orientation is not critical as the E-field antenna 102B has a wide beam width (field of view).

The H-field antenna 102A is placed 308 near to, and oriented at an initial position, approximately orthogonal to, the E-field antenna 102B. That is, the H-field antenna 102A is oriented so that it is generally pointing toward the area of interest. The H-field antenna 102A may be handheld, or placed in a holder, as long as it can rotate freely.

The material setting, which designates the specified material to be detected, is input 310 via user input 116A, or may be provided by the controller 112A, and causes the first antenna interface 110A to provide a first current to the antenna components 102A1 and 102B1.

Different material settings cause the H-field antenna 102A to detect different materials. For example, a first material setting may cause the antenna 102A to detect a first type of metal, a second material setting may cause the antenna 102A to detect a different type of metal, a third material setting may cause the antenna 102A to detect a particular type of fluid, etc.

Preferably, the H-field antenna tube 406 (FIG. 4) is held by a human as it has been observed that the sensitivity and performance of the system 100 are enhanced if the H-field antenna tube 406 is held by a human and, in some situations, the system 100 will only operate properly if the H-field antenna tube 406 is held by a human. The exact reason for that enhancement has not yet been determined but it is believed that the inherent resistance, capacitance, and size of the human body may provide for additional coupling of the E-field and/or H-field to the coil 402 and/or the rod 404.

In an implementation, satisfactory performance was achieved with the H-field antenna 102A and the E-field antenna 102B being up to five feet apart. The exact limits of "near" or "in proximity to" have not yet been determined, but may be determined empirically, and that limit may be dependent upon the current provided by the current sources (602A and 602B in FIGS. 6A and 6B, respectively).

After inputting the material setting, if the specified material is present in the area of interest, the H-field antenna 102A will begin to move, re-orient itself, and stabilize at a second orientation, which will be approximately ±90 degrees from the initial orientation. There is a wait 312 for the H-field antenna 102A re-orients itself and stabilizes at the second orientation in the direction of the specified material. This indicates that the specified material has been detected.

It should be noted that the order of operations 304-310 is not critical; they may be performed in any desired order.

The switch 108 is then closed 314 so that the second antenna interface 110B is now connected to the antenna components 102A2 and 102B2.

The distance resistivity setting (the "distance setting"), which indicates the distance to the specified material, is then adjusted 316 via user input 116B, or controlled by the controller 112B, and causes the second antenna interface 110B to provide a second current to the antenna components 102A2 and 102B2 through switch 108. The H-field antenna 102A will begin to re-orient itself and then stabilize again at a third orientation.

This third orientation indicates the bearing to the specified material, and the distance to the specified material is determined based at least in part on the distance setting.

The orientation and distance (first distance) to the specified material can then be 318 displayed, read, recorded, printed, and/or sent to another system, and/or some other action may be taken. Thus, both the direction and distance from the passive detection system 100 are known, so the specified material has been detected and vectored. The method then ends 320.

If the material setting is ramped, such as from a low value to a high value (or vice versa), and if the specified material is present in the field of view of the E-field antenna 102B, then the orientation of the H-field antenna 102A will begin to change and, when the resistance 606A has a resistance equal to the resistivity of the specified material, then the H-field antenna 102A will change its orientation to be the third orientation. If the material value is ramped past that point then the H-field antenna 102A will begin moving away from that third orientation.

The situation may be occur that the specified material is present in two or more locations, such as two different azimuths and/or distances. Therefore, operations 316-318 are preferably repeated one or more times to locate any other instances of the specified material. As the distance setting is further adjusted, for example, further increased, then the H-field antenna 102A will begin to move away from the third orientation. If the specified material is also present at a second location then, as the material value is increased further, then the H-field antenna 102A will continue to move, and will then stabilize again at another orientation, for example, a fourth orientation, pointing toward that second location. The distance (second distance) to the second occurrence of the specified material can then be determined based, at least in part, on the distance setting. Thus, the vector (fourth orientation, second distance) to the specimen are known.

The vector to this next location of the specified material can then be recorded 318. If the distance setting is varied further (e.g., increased further), the H-field antenna 102A will then begin to move away from the fourth orientation. If yet another sample of the specified material is present in the area of interest then, as the distance setting continues to increase, the H-field antenna 102A will then begin re-orienting itself to point to the next location. The orientation and distance to this next location of the specified material can then be recorded. The resistivity value can then be varied further until no more locations are found. Preferably, the distance setting is varied through at least part of its range. More preferably, the distance setting is varied through most or all its entire range so as to locate all instances of the specified material in the area of interest.

Although the above discussion refers to the distance setting being increased, that is merely a preference, the distance setting may start at a high resistivity value and then be decreased.

In the embodiment shown, the resistivity value is divided by 3.95 to get the approximate distance in feet. For convenience of implementation and calculation, however, the resistivity value is divided by 4 to get the approximate distance in feet. This value (four) provides sufficiently accurate results for most purposes. That value (3.95) was determined empirically using the current value specified herein to be provided by the current source. The distance in meters may be determined, if desired, by dividing the resistivity value by 12.96 (or 13, for simplicity). A current value different from the current value specified herein may, and likely will, result in a different conversion factor.

Figure 4:
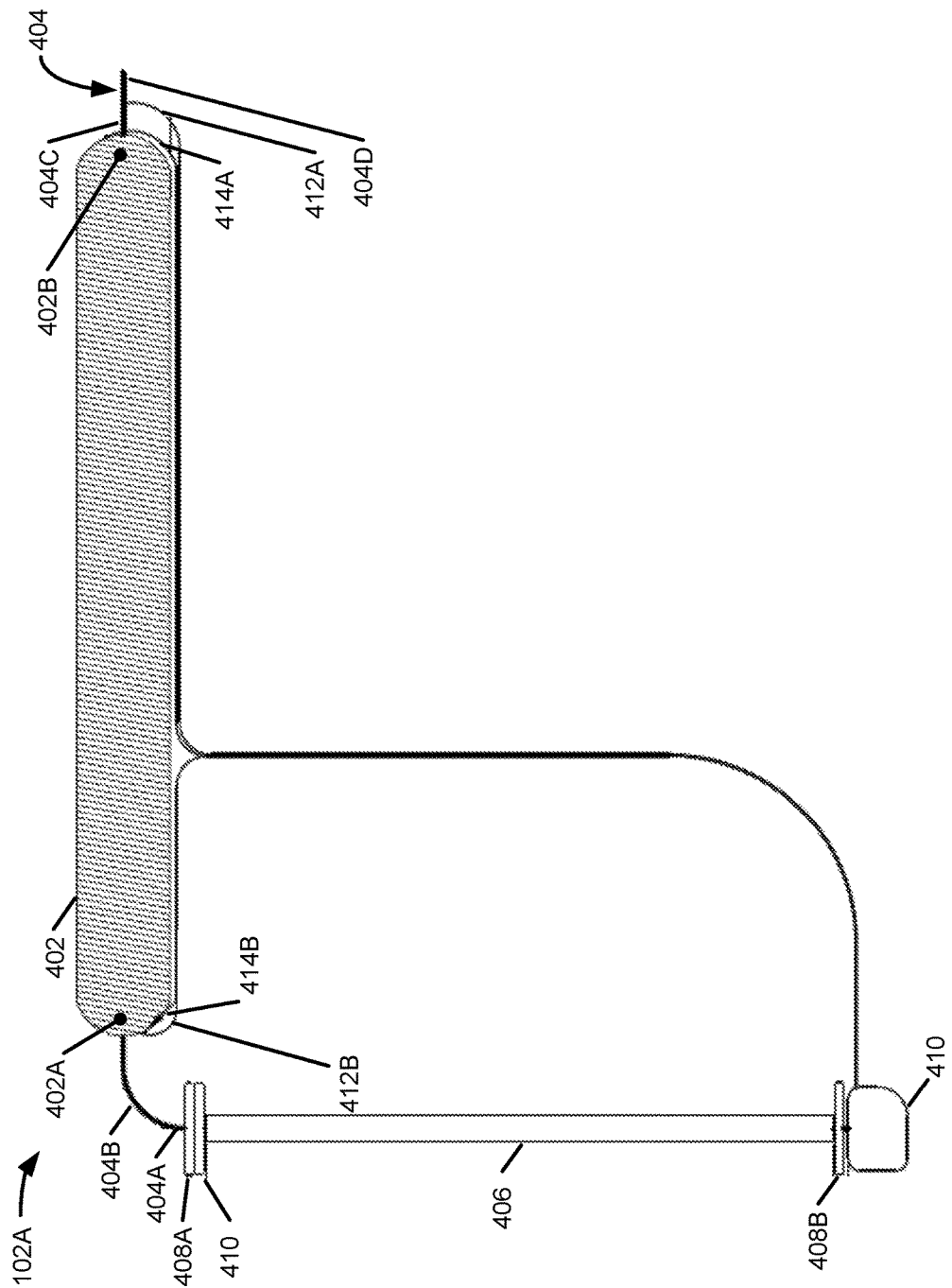
FIG. 4 is a drawing of an exemplary H-field antenna.
Figure 4A:
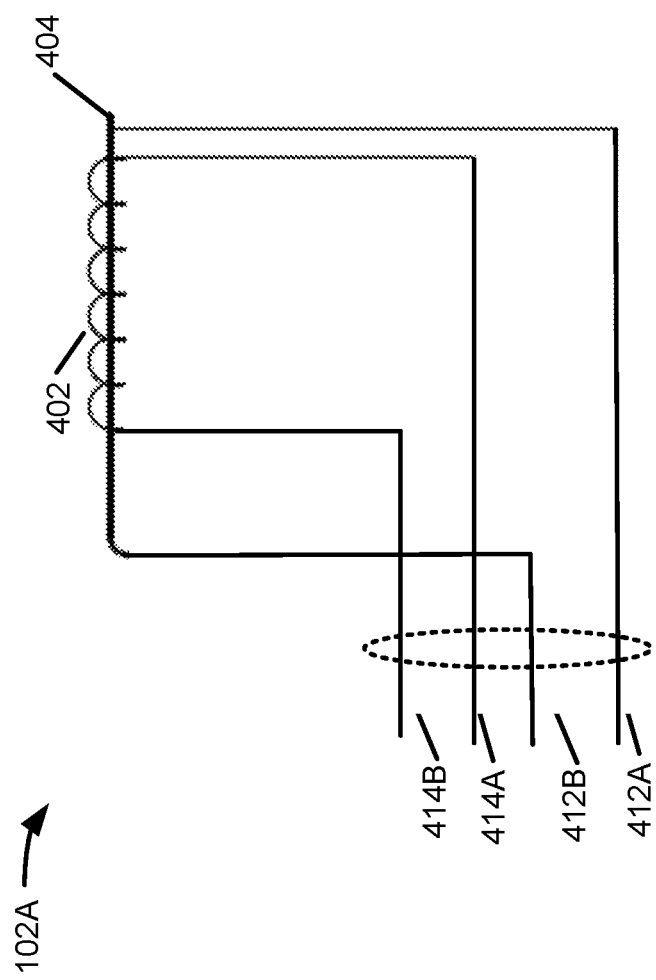
FIG. 4A is a schematic diagram of the H-field antenna.

FIG. 4 is a drawing of an exemplary H-field antenna 102A, and FIG. 4A is a schematic diagram of the H-field antenna 102A. The H-field antenna 102A comprises a coil 402 (component 102A1) and a rod 404 (component 102A2). The coil 402 comprises 3000 turns of #24 enameled copper wire, has a diameter of 0.75 inch, and has a length of 7.25 inches. These figures are preferred, and were determined empirically, but are not critical. The ends 402A, 402B of the coil 402 are connected to a connector 410 by conductors 414A, 414B.

The rod 404 is preferably a 3/16-inch 0.99 pure nickel rod having a first section 404A height of 5.75 inches, a 90-degree bend 404B, and a second section 404C length of 8.5 inches. Other electrically conducting, magnetic materials may also be used. The coil 402 is wrapped around the second section 404C. The second section 404C of the rod 404 forms a magnetic core for the coil 402 and also supports the coil 402.

The free end 404D of the rod 404 is connected to the connector 410 by a first wire 412A. The rod 404, near the point where the coil 402 ends, is connected to the connector 410 by a second wire 412B. The rod 404 may be considered to be at least a partial loop of a conductor running along the core of coil 404.

The first section 404A is preferably located inside a 5/16 inch diameter brass tube or sleeve 406. There are two stainless steel clinch washers 408A, 408B, one on each end of the tube 406. There is also a stainless steel flat washer 410, which is between the washer 408A and the top of the tube 406. The tube and the washers 408A, 408B, 410 allow the rod 404 (and coil 402) to freely rotate. Different materials may be used for the tube 406 and the washers 408A, 408B, 410 but the material used should have a low coefficient of friction with respect to rotation of the first section 404A, and is preferably non-magnetic.

Figure 5:
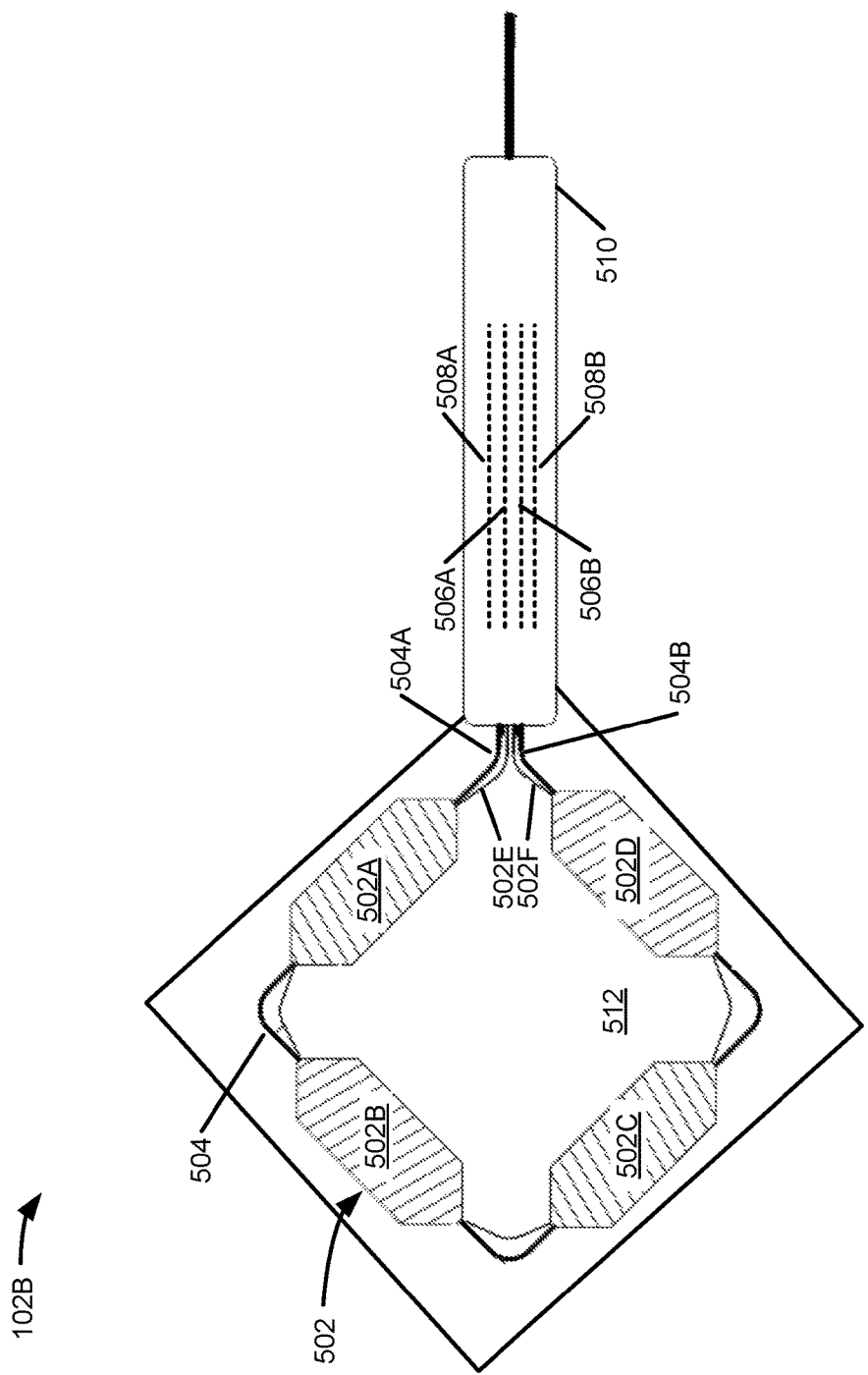
FIG. 5 is a drawing of an exemplary E-field antenna.
Figure 5A:
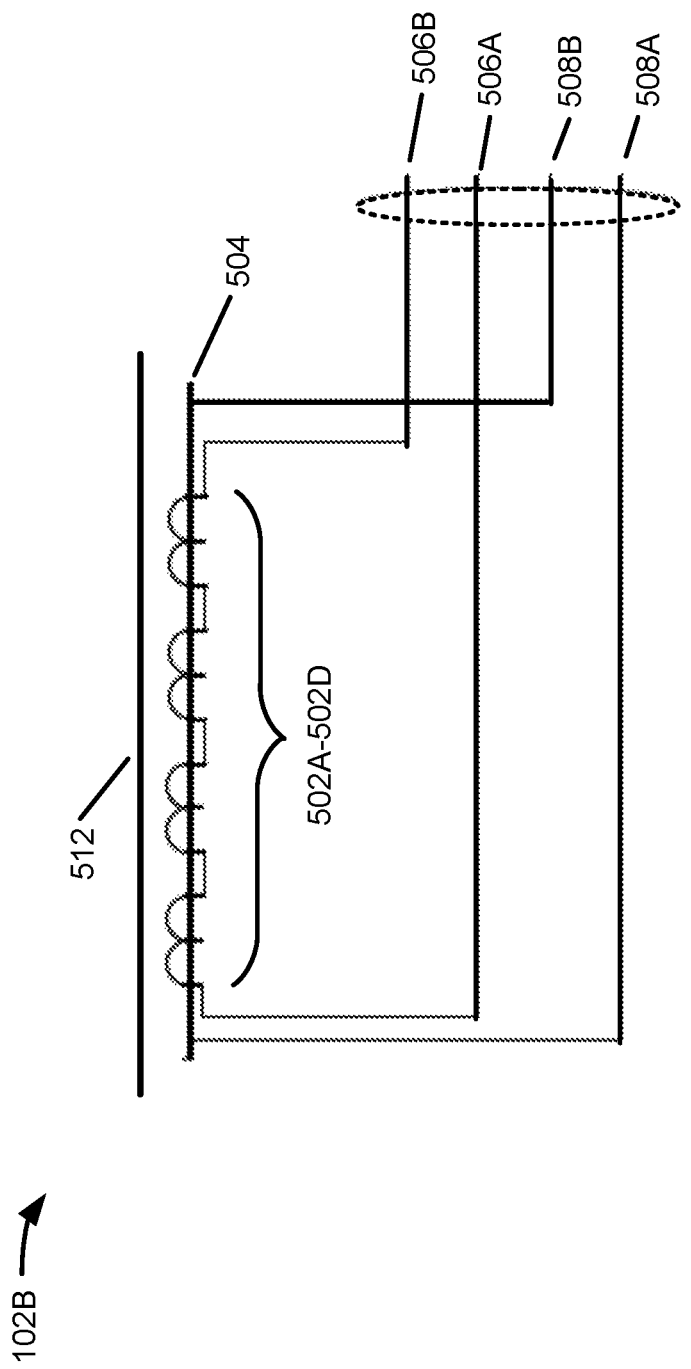
FIG. 5A is a schematic diagram of the E-field antenna.

FIG. 5 is a drawing of an exemplary E-field antenna 102B and FIG. 5A is a schematic diagram of the E-field antenna. The E-field antenna 102B comprises a coil 502 (component 102B1) and a rod 504 (component 102B2). Coil 502 comprises four coils 502A-502D, connected in series and supported by the rod 504. Each coil 502A-502D comprises 800 turns of #24 enameled copper wire and has a diameter of 0.75 inch and a length of 2 inches. These figures are preferred, and were determined empirically, but are not critical. The ends 502E, 502F of the coil 502 are connected to respective conductors 506A, 506B inside of, or near an end of, an insulated handle 510. The handle 510 provides a convenient means for moving and positioning the E-field antenna 102B.

The rod 504 is a 3/16-inch 0.99 pure nickel rod bent roughly into a square, each side of the square having a length of 3.25 inches. Another electrically conducting, magnetic material may also be used. Each side forms the magnetic core of a respective coil 502A-502D and supports that coil 502A-502D. The ends 504A, 504B of the rod 504 are inside of, or extend through, the handle 510, and are connected to respective conductors 508A, 508B. The rod 504 may be considered to be a single turn conductor running along the core of coil 502.

The E-field antenna 102B also preferably comprises a conductive backside shield 512, such as a copper plate. Other electrically conducting, non-magnetic materials may also be used. The backside shield 512 provides directionality to the E-field antenna 102B and may be square, as shown, round, or another convenient shape which blocks backside E-fields.

Figure 6A:
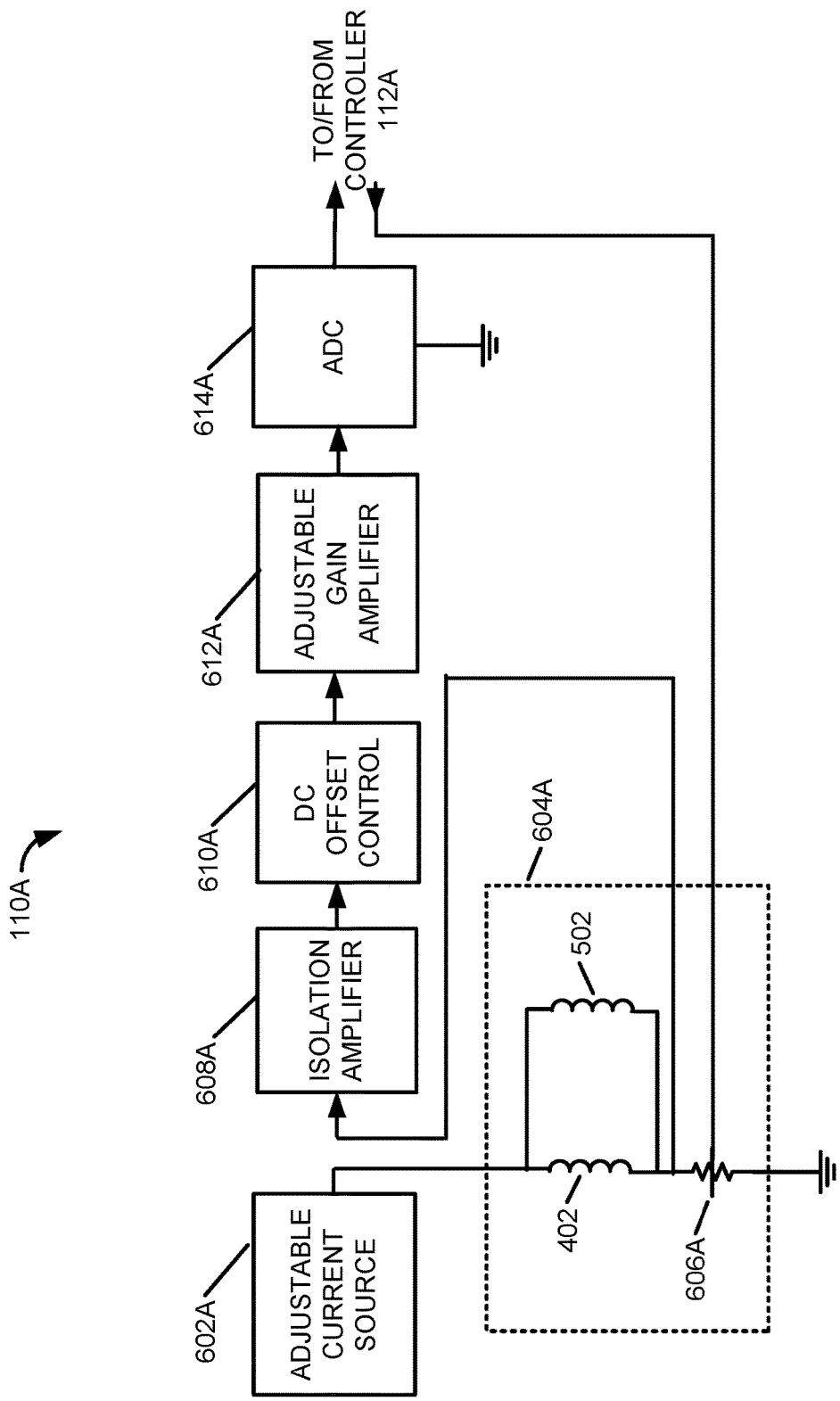
FIG. 6A is a schematic diagram of an exemplary first antenna interface.

FIG. 6A is a schematic diagram of an exemplary first antenna interface 110A. A current source 602A provides a current output to a parallel-series circuit 604A. The parallel-series circuit 604A comprises the parallel combination of coils 402 and 502 (502A-502D) in series with an adjustable resistor 606A. The current provided by the current source 602A provides a biasing current to the coils 402 and 502 and a voltage is thereby developed across the parallel-series circuit 604A. The output current of the current source 602A is preferably in the range of up to approximately 40 microamps and, more preferably, is 5 microamps. The current source 602A may have an adjustable output current.

The resistor 606A is preferably an adjustable resistor, the resistance of which can be varied manually or by the controller 112A. The material which is detected is determined, at least in part, by the setting (resistance value) of resistor 606A. The adjustable resistor 606A preferably has a range of 1 ohm to 59,999,999 ohms, and can be adjusted in steps of 1 ohm or greater and, more preferably, has a range of 1 ohm to approximately 2 megohms, adjustable in steps of 1 ohm or greater.

The voltage developed across the resistor 606A is provided to an isolation amplifier 608A, which buffers the voltage. The output of isolation amplifier 608A is provided to a DC offset control circuit 610A which sets the baseline output voltage to be at zero volts (or any other voltage which is convenient to work with given the particular technology being used). The output of the DC offset control circuit 610A is provided to an adjustable gain amplifier 612A which adjusts the amplification of the output of the DC offset control circuit 610A so that the range of the output voltage signal from the adjustable gain amplifier 612A is preferably as large as possible (greatest dynamic range) for the particular technology being used. The output of the amplifier 612A is then provided to an analog-to-digital converter (ADC) 614A. The output of the ADC 614A is then provided to the controller 112A, which can then determine the resistivity (material) setting from the output from the ADC 614A. The components 608A-614A may be considered to be a circuit which measures the voltage across the resistor 606A.

Two different modes of operation are provided by FIG. 6A: a manual mode, and an automatic mode. In the manual mode, the resistance of resistor 606A is adjusted manually, such as by using a resistor switch box. When the H-field antenna orientation has stabilized (operation 312) the resistivity of the resistor 606A can be determined by reading the settings of the switch box, or by measuring the voltage (V) developed across the parallel-series circuit 604A. As the current (I) provided by the current source 602A is known, or can be measured, the resistivity (R) can be determined by R=V/I. In this manual mode the voltage may be manually read at the output of adjustable gain amplifier 612A, or the output of the ADC 614A may be provided to a display 114A, directly or via the controller 112A.

In the automatic mode, the controller 112A can directly control the resistivity of the resistor 606A so it is not necessary to measure the voltage across the parallel-series circuit 604A to determine the resistivity of resistor 606A. Therefore, in the automatic mode, components 608A-614A are not needed.

If the system 100 is to be used to detect only a single type of material, for example, gold, then the value of resistor 606A may be fixed at the resistivity setting for gold. If the system 100 is to be used to detect two materials, for example, gold and silver, then a switch may be used to select between two different resistivity values, or to instruct the controller 112A to select one of two different resistivity values. If three materials are to be detect, for example, gold, silver, platinum, then three different switch settings would be available, and so on. Thus, the system 100 may be a general-purpose detection system (a large range of possible resistivity values) or may be a special purpose detection system (one, two, three, or another limited selection of, resistivity values).

Figure 6B:
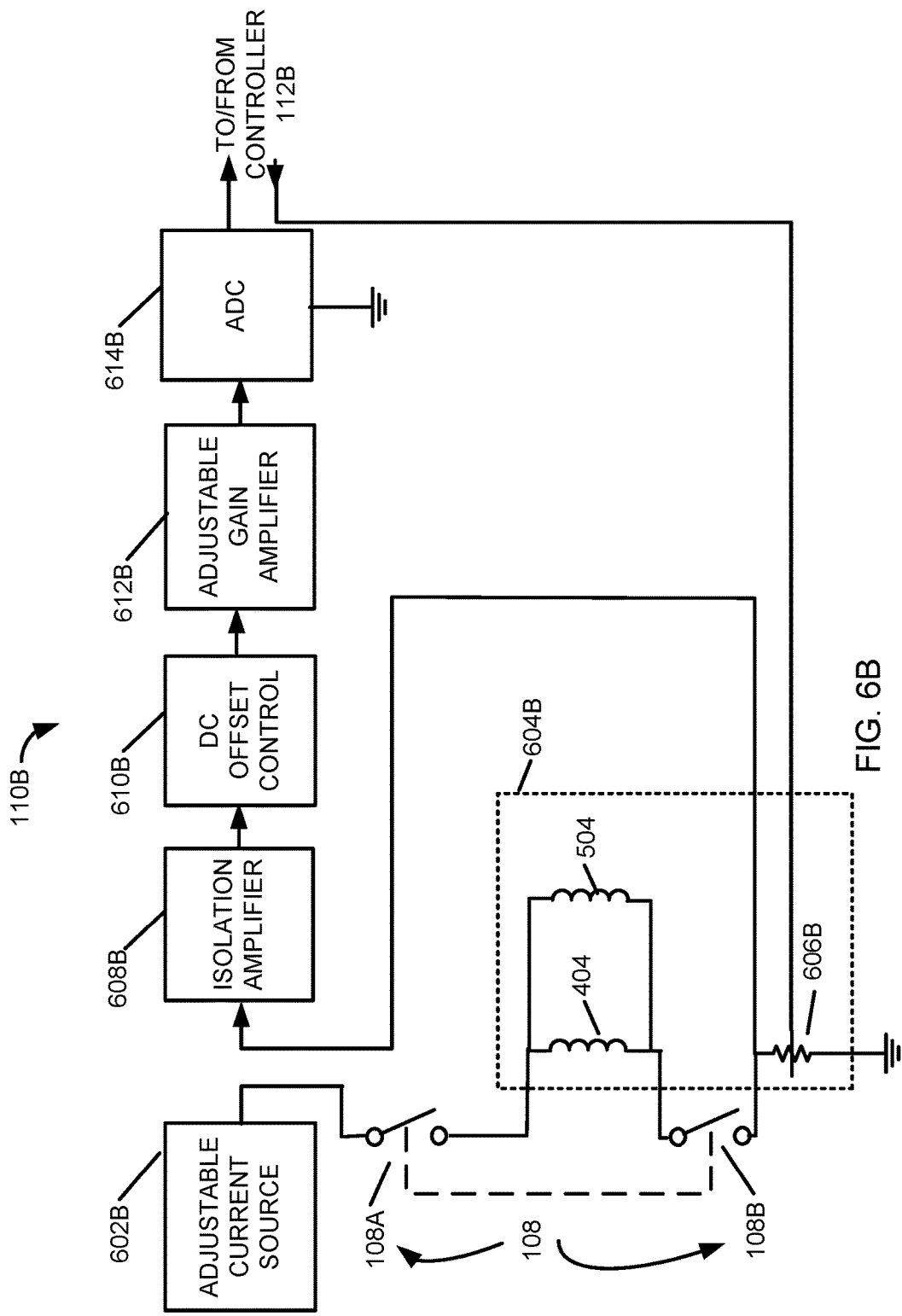
FIG. 6B is a schematic diagram of an exemplary second antenna interface.

FIG. 6B is a schematic diagram of an exemplary second antenna interface 110B. A source 602B, which preferably has an adjustable output current, provides a current output through one section 108A of a switch 108 to one end of the parallel combination of rods 404 and 504. The other end of the parallel combination of rods 404 and 504 is connected through another section 108B of switch 108 to one end of an adjustable resistor 606B. The other end of resistor 606B is connected to circuit ground. The parallel combination of rods 404 and 504 in series with resistor 606B is referred to as parallel-series circuit 604B.

When the switch 108 is open the parallel combination of rods 404 and 504 is isolated from the other circuitry.

When the switch 108 is closed the current provided by the current source 602B provides a biasing current to the rods 404 and 504, and a voltage is thereby developed across the parallel-series circuit 604B. The output current of the current source 602B is preferably in the range of up to approximately 40 microamps and, more preferably, is approximately 5 microamps. The current source 602B may have an adjustable output current.

The resistor 606B is preferably an adjustable resistor, the resistance of which can be varied manually or by the controller 112B. The distance to the detected material is determined, at least in part, by the setting (resistance value) of resistor 606B when the antenna 102A has turned to point in the third direction (operation 316). The resistor 606B preferably has a range of 1 ohm to 59,999,999 ohms, and can be adjusted in steps of 1 ohm or greater and, more preferably, has a range of 1 ohm to approximately 2 megohms, adjustable in steps of 1 ohm or greater.

The voltage developed across the resistor 606B is provided to an isolation amplifier 608B, which buffers the voltage. The output of isolation amplifier 608B is provided to a DC offset control circuit 610B which sets the baseline output voltage to be at zero volts (or any other voltage which is convenient to work with given the particular technology being used). The output of the DC offset control circuit 610B is provided to an adjustable gain amplifier 612B which adjusts the amplification of the output of the DC offset control circuit 610B so that the range of the output voltage signal from the adjustable gain amplifier 612B so that the range of the output voltage signal from the adjustable gain amplifier 610A is preferably as large as possible (greatest dynamic range) for the particular technology being used. The output of the amplifier 612B is then provided to an analog-to-digital converter (ADC) 614B. The output of the ADC 614B is then provided to the controller 112B, which can then determine the resistivity (distance) setting from the output of the ADC 614B. The components 608B-614B may be considered to be a circuit which measures the voltage across the resistor 606B.

If the switch 108 is open then the output of the ADC 614B is preferably ignored by the controller 112B.

Similar to the operation described with respect to FIG. 6A, two different modes of operation are provided by FIG. 6B: a manual mode, and an automatic mode. In the manual mode, the resistance of resistor 606B is adjusted manually, such as by using a resistor switch box. When the H-field antenna orientation has stabilized (operation 316) the resistivity of the resistor 606B can be determined by reading the settings of the switch box, or by measuring the voltage (V) developed across the parallel-series circuit 604B. As the current (I) provided by the current source 602B is known, or can be measured, the resistivity (R) can be determined by R=V/I. In this manual mode the voltage may be manually read at the output of adjustable gain amplifier 612B, or the output of the ADC 614B may be provided to a display 114B, directly or via the controller 112B.

In the automatic mode, the controller 112B can directly control the resistivity of the resistor 606B so it is not necessary to measure the voltage across the parallel-series circuit 604B to determine the resistivity of the resistor 606B. Therefore, in the automatic mode, components 608B-614B are not needed.

As an aid in understanding the operation of the system 100 described herein, it may help to understand that if the area within the range and view of the antennas 102A and 102B is uniform (e.g., the area consists of a single material, such as sand, or water) then the H- and E-fields will be uniform. If a different material is present within that area (e.g., gold, silver, oil, a metal boat) then the presence of that material will cause a disturbance in the H- and E-fields around that material. This disturbance can be used to detect that material.

A rotary encoder (not shown), also known as a shaft encoder, may be used to determine the orientation of the H-field antenna 102A. The user can thereby use an input control, such as 116A, to notify the system 100 that the direction of orientation of the H-field antenna has become stable and the system 100 will then record the direction indicated by the rotary encoder. If desired, the output of the rotary encoder may be monitored by the controller 112A to determine that the output has stabilized, and the system 100 will then record the direction indicated by the rotary encoder.

Up until this point the switch 108 is open. Also, at this point, the specified material has been detected. Therefore, the system can be used to simply detect the presence of a specified material in an area of interest, with the actual location to be determined later.

Once the orientation of H-field antenna 102A has stabilized and the presence of the specified material has therefore been detected, switch 108 is closed. The current output of current source 602B is then provided to bias the rods 404 and 504 and the resistance of resistor 606B is varied until the H-field antenna 102A rotates and becomes stable again, now pointing approximately 90 degrees (orthogonal)(third direction) to the first direction.

Once the direction of the H-field antenna 102A has again become stable the user can record or take note of the value of the resistance of resistor 606B and use the input control, such as 116A, to notify the system 100 that the direction of orientation of the H-field antenna has again become stable and the system 100 will then record the resistance value of resistor 606B. The resistance value of resistor 606B can then be used to determine the distance to the material.

If a rotary encoder (not shown) is being used then the output of the rotary encoder may be monitored by the controller 112B to determine that the H-field antenna has moved and is again stable. The system 100 can then automatically record or process the value of the resistance of resistor 606B to determine the distance to the material.

Thus, the vector (direction and distance) to the detected material has been determined and may be displayed, read, stored, transferred, etc., or otherwise acted upon.

Figure 7:
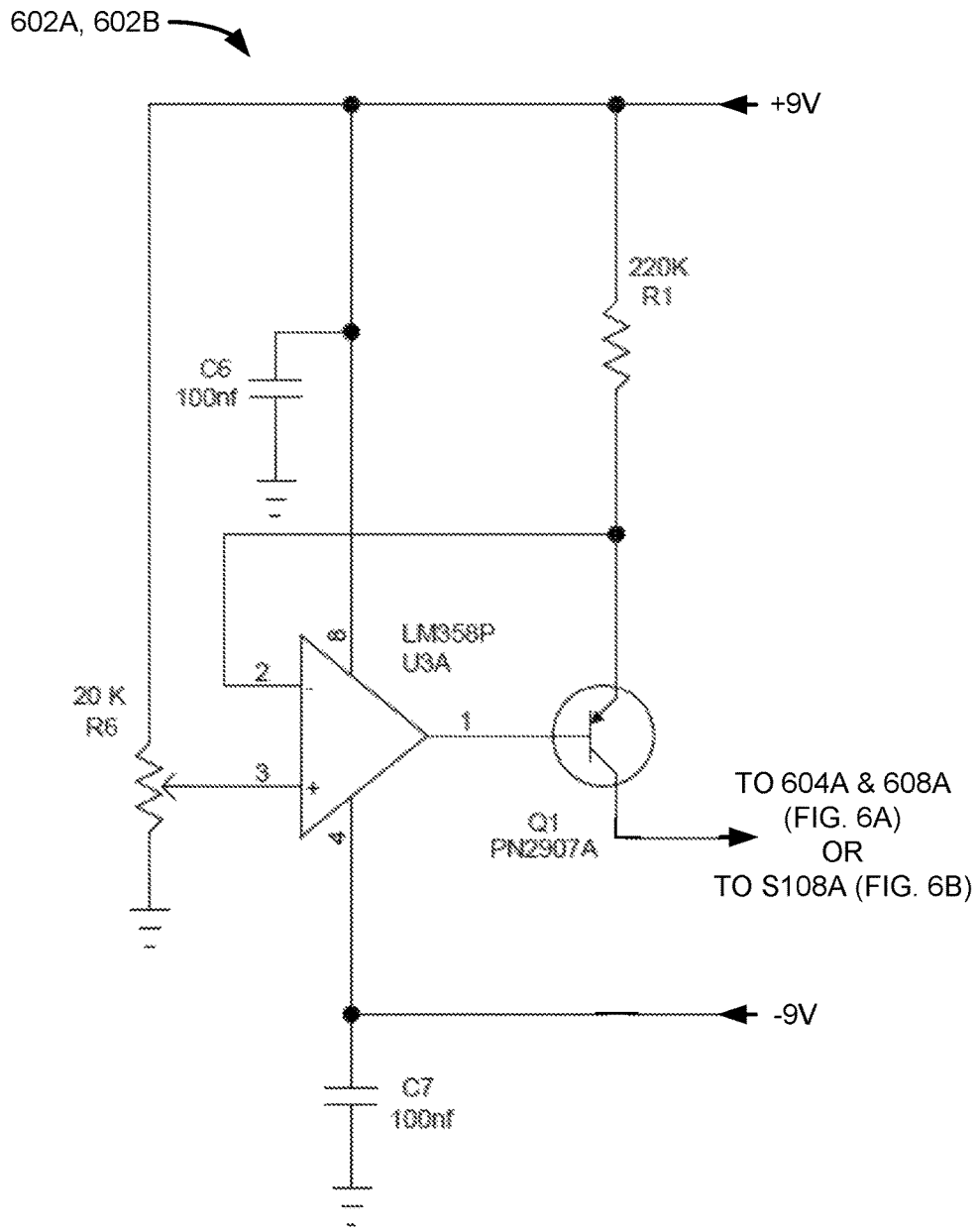
FIG. 7 is a schematic diagram of an exemplary current source.

FIG. 7 is a schematic diagram of an exemplary current source 602A, 602B, implemented by an operational amplifier (op-amp) U3A, transistor Q1, resistor R1, and potentiometer R6. Capacitors C6 and C7 are power supply noise filtering capacitors. The output current of transistor Q1 is primarily determined by the setting of the potentiometer R6 and the value of resistor R1. Also, within the limit set by the power supply voltage and the value of resistor R1, current sources 602A, 602B function as constant current sources. Beyond that limit, however, current sources 602A, 602B function as current-limited, constant voltage sources. The output (collector) of transistor Q1 of current source 602A goes to the components 604A and 608A of FIG. 6A, and the output of transistor Q1 of current source 602B goes to switch 108A of FIG. 6B.

Figure 8:
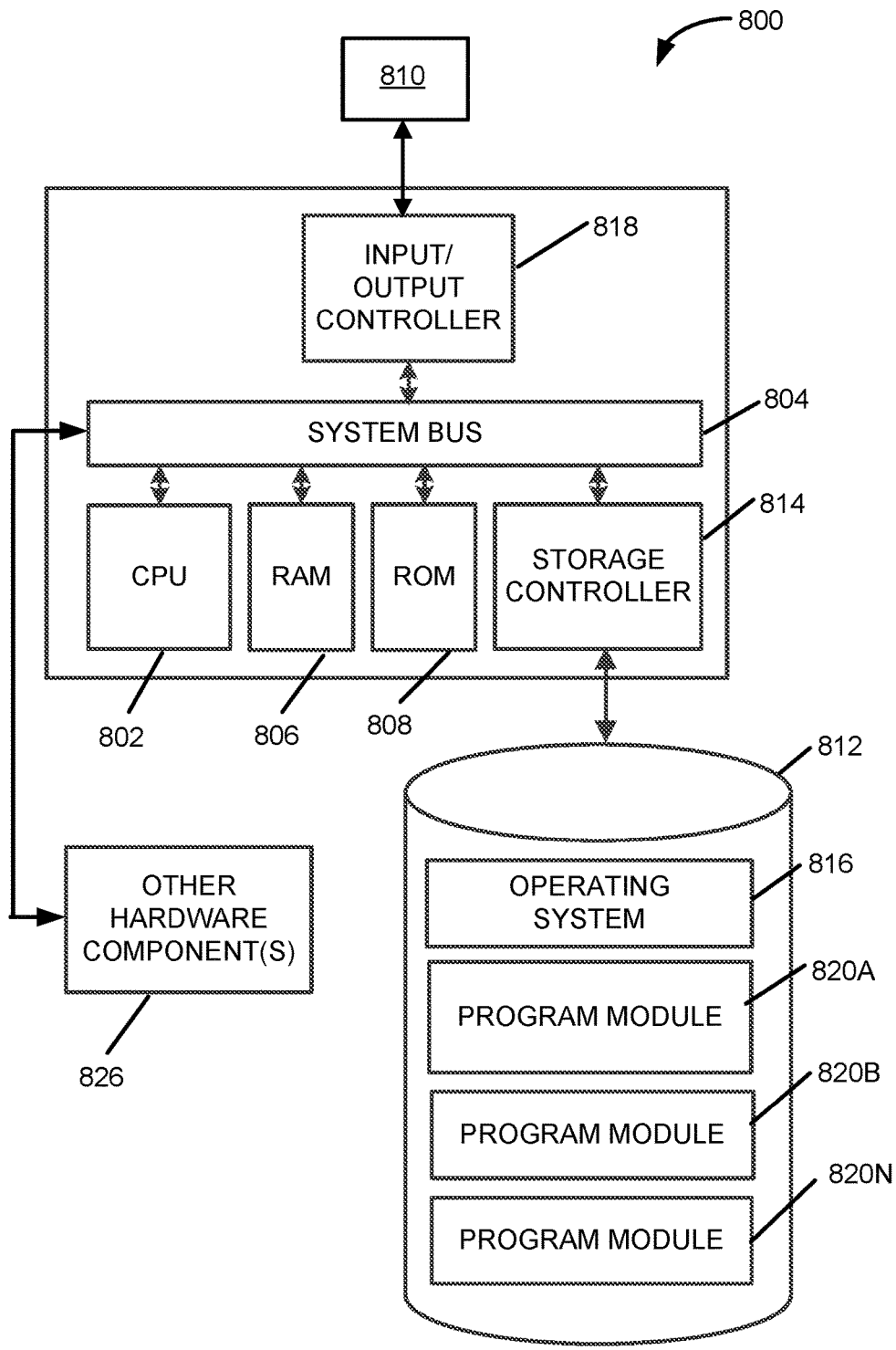
FIG. 8 is a block diagram of a controller for the passive detection and vectoring system.

FIG. 8 illustrates exemplary computer architecture 800 suitable for the controllers 112A, 112B, and the consolidation thereof. The computer architecture 800 may be utilized to execute any aspects of the software operations presented herein. The exemplary computer architecture 800 includes one or more central processing units 802 ("CPU"), a system memory including a random-access memory 806 ("RAM") and a read-only memory ("ROM") 808, and a system bus 804 that couples the memories 806, 808 to the CPU 802. A basic input/output system containing the basic routines that help to transfer information between elements within the computer architecture 800, such as during startup, is stored in the ROM 808. The computer architecture 800 further includes a mass storage device 812 for storing the operating system 816 and one or more programs or modules 820A-820N.

Examples are programs or modules to look up and provide the settings for the H-field antenna, determine whether the orientation of the H-field antenna has stabilized, to open/close switch 108, to vary the E-field settings, to determine the distance to the material based at least in part on the E-field setting, to capture setting information and user inputs to populate a table of settings for one or more material types, etc.

The mass storage device 812 is connected to the CPU 802 through a mass storage controller 814 connected to the bus 804. The mass storage device 812 and its associated computer-readable media provide non-volatile storage for the computer architecture 800. Although the memories 806 and 808 and mass storage device 812 are preferably separate components, one or both of the memories 806 and 808 could be included in the mass storage device 812. The memories 806 and 808, and mass storage device 812, may be individually or collectively considered to be, and referred to as, a memory device, or as computer-readable media.

The input/output controller 818 may be connected to one or more user input devices 116 and/or one or more user display devices 114. The input/output controller 818 may also be connected to one or more communication devices 710 which provide one or more communication links to one or more external devices or systems (not shown) so that settings and/or other information may be uploaded, downloaded, and/or other action taken. By way of example, and not limitation, a communication device 710 includes transmitters and receivers which communicate over one or more communication links including wired media, such as a wired network or direct-wired connection, and/or communicate over wireless media, such as acoustic, RF, infrared, optical, cellular, or WiFi. Combinations of any of the above are also included within the scope of a "communication link."

Other hardware components 826 may also be present such as, for example, the antenna interfaces 106A, 106B, a rotary encoder (not shown) for determining the position of the antenna 102A, the switch 108, a sensor component, such as a magnetometer, a sound or laser range measuring device, a global positioning system (GPS) sensor, a microphone or other audio input device, a camera, a printer, etc.

"Computer-readable media" includes, but is not limited to, volatile and non-volatile media, removable and non-removable media, implemented in any method or technology, for storage of information such as computer-readable instructions, data structures, program modules or other data. For example, computer-readable media includes, but is not limited to RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage, a hard disk, or other magnetic storage device, or any other medium which can be used to store the desired information and which can be accessed by the computer architecture 800. For purposes of the claims, the terms "computer-readable media," "computer storage medium," "computer storage media," "computer-readable storage media," and variations thereof, do not include waves, signals, and/or other transitory and/or intangible communication media, per se, and the broadest reasonable interpretation of these terms does not include waves, signals, and/or other transitory and/or intangible communication media per se, or interpretations which are prohibited by applicable statutory or judicial law.

It should be appreciated that the software components described herein, when loaded into the CPU 802 and executed, transform the CPU 802 and the overall computer architecture 800 from a general-purpose computing system into a special-purpose computing system customized to facilitate the functionality presented herein. The CPU 802 may be constructed from any number of transistors or other discrete circuit elements, which may individually or collectively assume any number of states. More specifically, the CPU 802 may operate as a finite-state machine, in response to executable instructions contained within the software modules disclosed herein. The CPU 802 may be a single processor, or may be a plurality of processors. The computer-executable instructions may transform the CPU 802 by specifying how the CPU 802 transitions between states, thereby transforming the transistors or other discrete hardware elements constituting the CPU 802.

Encoding the software modules presented herein also may transform the physical structure of the computer-readable media presented herein. The specific transformation of physical structure may depend on various factors, in different implementations of this description. Examples of such factors may include, but are not limited to, the technology used to implement the computer-readable media, whether the computer-readable media is characterized as primary or secondary storage, and the like. For example, if the computer-readable media is implemented as semiconductor-based memory, the software disclosed herein may be encoded on the computer-readable media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer architecture in order to store and execute the software components presented herein. It also should be appreciated that the computer architecture may include other types of computing devices, including hand-held computers, embedded computer systems, personal digital assistants, and other types of computing devices known to those skilled in the art. It is also contemplated that the computer architecture may not include all of the components shown herein, may include other components that are not explicitly shown herein, or may utilize an architecture completely different than that shown herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. For brevity and/or clarity, well-known functions or constructions may not be described in detail herein.

As used herein, the terms "free to rotate", "freely rotate", and the like mean that any friction or other force tending to inhibit movement of a component, especially rotation of the component, are small or insignificant compared to a force tending to rotate the component.

The term "exemplary" is used herein to mean serving as an example, instance, or illustration. Any aspect or design described herein as "exemplary" is not necessarily to be construed as preferred or advantageous over other aspects or designs. Similarly, examples are provided herein solely for purposes of clarity and understanding and are not meant to limit the subject innovation or portion thereof in any manner. It is to be appreciated that a myriad of additional or alternate examples could have been presented, but have been omitted for purposes of brevity.

All, or portions of, the subject innovation may be implemented as a method, apparatus, or article of manufacture using standard programming and/or engineering techniques to produce software, firmware, hardware, or any combination thereof to control, or to be controlled by, a computer to implement the disclosed innovation. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards and flash memory devices (e.g., card, stick, jump drive . . . ). Additionally, it should be appreciated that a carrier wave can be employed to carry computer-readable electronic data such as those used in transmitting and receiving electronic mail or in accessing a network such as the Internet or a local area network (LAN).

The terms "for example" and "such as" mean "by way of example and not of limitation." The subject matter described herein is provided by way of illustration for the purposes of teaching, suggesting, and describing, and not limiting or restricting. Combinations and alternatives to the illustrated embodiments are contemplated, described herein, and set forth in the claims.

For convenience of discussion herein, when there is more than one of a component, that component may be referred to herein either collectively or singularly by the singular reference numeral unless expressly stated otherwise or the context indicates otherwise. For example, components 112 (plural) or component 112 (singular) may be used unless a specific component is intended. Also, the singular forms "a," "an," and "the" are intended to include the plural forms as well, unless expressly stated otherwise or the context indicates otherwise.

It will be further understood that the terms "includes," "comprises," "including," and/or "comprising," when used in this specification, specify the presence of stated features, steps, operations, elements, and/or components, but do not preclude the presence or addition of one or more other features, steps, operations, elements, components, and/or groups thereof.

The terms "includes," "has" or "having" or variations in form thereof are intended to be inclusive in a manner similar to the term "comprises" as that term is interpreted when employed as a transitional word in a claim.

It will be understood that when a component is referred to as being "connected" or "coupled" to another component, it can be directly connected or coupled, mechanically, hydraulically, electrically, electronically, wirelessly, etc., to the other component, or one or more intervening components may be present.

The term "and/or" includes any and all combinations of one or more of the associated listed items. As used herein, phrases such as "between X and Y" and "between about X and Y" should be interpreted to include X and Y unless otherwise specifically noted.

Terms such as "about", "approximately", and "substantially" are relative terms and indicate that, although two values may not be identical, their difference is such that the apparatus or method still provides the indicated or desired result, or that the operation of a device or method is not adversely affected to the point where it cannot perform its intended purpose. As an example, and not as a limitation, if a height of "approximately X inches" is recited, a lower or higher height is still "approximately X inches" if the desired function can still be performed or the desired result can still be achieved.

While the terms vertical, horizontal, upper, lower, bottom, top and the like may be used herein, it is to be understood that these terms are used for ease in referencing the drawing and, unless otherwise indicated or required by context, does not denote a required orientation.

The different advantages and benefits disclosed and/or provided by the implementation(s) disclosed herein may be used individually or in combination with one, some or possibly even all of the other benefits. Furthermore, not every implementation, nor every component of an implementation, is necessarily required to obtain, or necessarily required to provide, one or more of the advantages and benefits of the implementation.

Conditional language, such as, among others, "can", "could", "might", or "may", unless specifically stated otherwise, or otherwise understood within the context as used, is generally intended to convey that certain embodiments preferably or optionally include certain features, elements and/or steps, while some other embodiments optionally do not include those certain features, elements and/or steps. Thus, such conditional language indicates, in general, that those features, elements and/or step may not be required for every implementation or embodiment.

Those skilled in the art will recognize many modifications may be made to the implementation(s) disclosed herein without departing from the scope or spirit of the claimed subject matter. The subject matter described above is provided by way of illustration only and should not be construed as limiting. Furthermore, the claimed subject matter is not limited to implementations that solve any or all disadvantages noted in any part of this disclosure. Various modifications and changes may be made to the subject matter described herein without following the exemplary embodiments and applications illustrated and described, and without departing from the spirit and scope of the following claims.

What has been described above includes examples of aspects of the claimed subject matter. It is, of course, not possible to describe every conceivable combination of components or methodologies for purposes of describing the claimed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims.

Although the subject matter presented herein has been described in language specific to computer structural features, methodological and transformative acts, specific computing machinery, and computer-readable media, it is to be understood that the appended claims are not necessarily limited to the specific features, acts, or media described herein. Rather, the specific features, acts and mediums are disclosed as example forms of implementing the claims.

The invention claimed is:

1. An apparatus comprising:
a first antenna having a field of view, being in a first orientation, and comprising a first coil and a first conductive core;
a second antenna comprising a second coil and a second conductive core, the second conductive core having a first arm extending through the second coil and a second arm defining a vertical axis approximately orthogonal to the first arm, the second antenna being free to rotate about the vertical axis;
a first circuit comprising a parallel combination of the first coil and the second coil which is electrically connected in series with a first resistor, the first resistor having a resistance value corresponding to a resistivity of a specified material;
a second circuit comprising a first switch electrically connected in series with a parallel combination of the first conductive core and the second conductive core, a second switch, and a second resistor, the second resistor having a range of resistance values;
a first current source to provide a first current to the first circuit;
a second current source to provide a second current to the second circuit when the first switch and the second switch are closed;
wherein, when the first switch and the second switch are open, the second antenna points to a second orientation approximately orthogonal to the first orientation to indicate that the specified material has been detected in the field of view of the first antenna;
wherein, when the first switch and the second switch are closed, and the resistivity of the second resistor is adjusted, the orientation of the second antenna moves away from pointing in the second orientation and stabilizes pointing in a third orientation;
wherein the third orientation indicates an orientation to the specified material; and
wherein the resistance value of second resistance corresponds to a distance to the specified material.

2. The apparatus of claim 1, wherein:
the first conductive core comprises a rod having a first section, a second section, a third section, and a fourth section, the first section, second section, third section, and fourth section approximately forming a square; and
the first coil comprises the series-connected arrangement of a predetermined number of turns of an insulated wire wound around the first section, the predetermined number of turns of the insulated wire wound around the second section, the predetermined number of turns of the insulated wire wound around the third section, and the predetermined number of turns of the insulated wire wound around the fourth section.

3. The apparatus of claim 2, wherein:
the first section, second section, third section, and fourth section each have a length of approximately 3.25 inches and approximately form a square; and
the predetermined number of turns is approximately 800.

4. The apparatus of claim 1, wherein:
the first antenna further comprises a conductive backside shield.

5. The apparatus of claim 1, wherein:
the second coil comprises a predetermined number of turns of an insulated wire wound around the second conductive core.

6. The apparatus of claim 5 wherein:
the second conductive core comprises a rod having a length of approximately 8.5 inches; and
the predetermined number of turns is approximately 3000.

7. The apparatus of claim 1, wherein the second antenna further comprises:
a vertical tube, the second arm being at least partially within the vertical tube;
wherein the second arm freely rotates within the vertical tube.

8. The apparatus of claim 1 and further comprising:
a third circuit responsive to a voltage across the first resistor to determine the resistance of the first resistor.

9. The apparatus of claim 1 and further comprising:
a fourth circuit responsive to a voltage across the second resistor to determine the resistance of the second resistor and to indicate the distance to the material based at least in part on the resistance of the second resistor.

10. The apparatus of claim 1 and further comprising:
a user input control; and
a controller responsive to an input from the user input control to set the resistance of the first resistor.

11. The apparatus of claim 1 and further comprising:
a user input control to select the specified material from a plurality of materials; and
a controller responsive to an input from the user input control to set the resistance of the first resistor to correspond to the resistivity of the specified material.

12. The apparatus of claim 1 and further comprising:
a user input control; and
a controller responsive to an input from the user input control to set the resistance of the second resistor.

13. A method comprising:
orienting a first antenna toward an area to be searched for a specified material, the first antenna comprising a first coil on a first conductive core and having a field of view;

placing a second antenna in proximity to the first antenna and in an initial orientation, the second antenna comprising a second coil on a second conductive core, the second conductive core having a first arm extending through the second coil and a second arm defining a vertical axis approximately orthogonal to the first arm, the second antenna being free to rotate about the vertical axis;

providing a first current to a first circuit while preventing application of a second current to a second circuit, the first circuit comprising a parallel combination of the first coil and the second coil electrically connected in series with a first resistor, the first resistor having a resistance corresponding to a resistivity of a specified material, the second circuit comprising a parallel combination of the first conductive core and the second conductive core electrically connected in series with a second resistor;

determining that the second antenna has rotated and stabilized at a second orientation; and subsequent to determining that the second antenna has stabilized at the second orientation:
  providing the first current to the first circuit and also providing the second current to the second circuit;
  adjusting the resistivity of the second resistor;
  determining that the second antenna has rotated and stabilized at a third orientation; and
  determining a distance to the specified material based at least in part on the resistivity of the second resistor when the second antenna has stabilized at the third orientation;

wherein the third orientation indicates an orientation to the specified material; and wherein the resistance value of second resistor corresponds to a distance to the specified material.

14. The method of claim 13, wherein the initial orientation is orthogonal to the first antenna.

15. The method of claim 13, and further comprising:
providing the first conductive core by providing a first rod having a first length; and
providing the first coil by wrapping a predetermined number of turns of an insulated wire around the first rod.

16. The method of claim 13, and further comprising:
providing the second conductive core by providing a second rod having a first section, a second section, a third section, and a fourth section, the first section, second section, third section, and fourth section approximately forming a square; and
providing the second coil by wrapping a predetermined number of turns of an insulated wire around the first section, wrapping the predetermined number of turns of the insulated wire around the second section, wrapping the predetermined number of turns of the insulated wire around the third section, and wrapping the predetermined number of turns of the insulated wire around the fourth section.

17. The method of claim 13, and further comprising:
providing a conductive backside shield for the first antenna.

18. The method of claim 13, wherein the predetermined axis is a vertical axis.

19. The method of claim 13 and, subsequent to determining the distance to the specified material, further comprising:
further adjusting the resistivity of the second resistor;
determining that the second antenna has rotated and stabilized at a fourth orientation; and
determining the resistivity of the second resistor when the second antenna has stabilized at the fourth orientation;
wherein the fourth orientation indicates an orientation to the specified material; and
wherein the resistance value of second resistor corresponds to a distance to the specified material.

20. An apparatus comprising:
a first antenna having a field of view, a first orientation, and comprising a first coil and a first conductive core;
a second antenna comprising a second coil and a second conductive core, the second conductive core having a first arm extending through the second coil and a second arm defining a vertical axis approximately orthogonal to the first arm, the second antenna being free to rotate about the vertical axis;
a first circuit comprising a parallel combination of the first coil and the second coil which is electrically connected in series with a first resistor, the first resistor having a resistance value corresponding to a resistivity of a specified material;
an isolated second circuit comprising a parallel combination of the first conductive core and the second conductive core;
a current source to provide a current to the first circuit;
wherein the second antenna points to a second orientation approximately orthogonal to the first orientation to indicate that the specified material has been detected in the field of view of the first antenna.

* * * * *